United States Patent
Sharma et al.

(10) Patent No.: US 7,447,920 B2
(45) Date of Patent: Nov. 4, 2008

(54) WORKLOAD PLACEMENT BASED ON THERMAL CONSIDERATIONS

(75) Inventors: Ratnesh K. Sharma, Union City, CA (US); Chandrakant D. Patel, Fremont, CA (US); Cullen E. Bash, San Francisco, CA (US); Richard J. Friedrich, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 828 days.

(21) Appl. No.: 10/929,448

(22) Filed: Aug. 31, 2004

(65) Prior Publication Data

US 2006/0047808 A1 Mar. 2, 2006

(51) Int. Cl.
*G06F 1/00* (2006.01)
*G06F 15/173* (2006.01)

(52) U.S. Cl. .............. 713/300; 709/223; 709/224; 709/226; 718/100; 718/104

(58) Field of Classification Search .......... 718/100, 718/102, 104, 105; 713/300; 709/223, 224, 709/226
See application file for complete search history.

(56) References Cited

U.S. PATENT DOCUMENTS

| | | | | |
|---|---|---|---|---|
| 6,795,928 | B2 * | 9/2004 | Bradley et al. | 713/320 |
| 6,889,908 | B2 * | 5/2005 | Crippen et al. | 236/49.3 |
| 7,058,826 | B2 * | 6/2006 | Fung | 713/300 |
| 7,197,433 | B2 * | 3/2007 | Patel et al. | 702/188 |
| 2003/0193777 | A1 * | 10/2003 | Friedrich et al. | 361/687 |
| 2005/0023363 | A1 * | 2/2005 | Sharma et al. | 236/49.3 |
| 2006/0259622 | A1 * | 11/2006 | Moore et al. | 709/226 |
| 2006/0259793 | A1 * | 11/2006 | Moore et al. | 713/300 |

OTHER PUBLICATIONS

Bianchini et al., Power and Energy Management for Server Systems, Nov. 2004, IEEE, pp. 68-76.*
Sharma et al., Balance of Power: Dynamic Thermal Management for Internet Data Centers, Feb. 18, 2003, pp. 1-13.*

* cited by examiner

*Primary Examiner*—Mark Connolly

(57) ABSTRACT

A method of workload placement among servers includes receipt of a workload request. The method also includes selection of a group of servers from a set of servers capable of performing the requested workload. In addition, server workload indexes, which are ratios of temperature rises due to re-circulation load for the servers in the group of servers to temperature rises due to re-circulation load for the set of servers, of the servers in the group of servers are calculated. Moreover, the workload is placed on one or more of the servers in the group of servers based upon the server workload indexes of the servers in the group of servers.

35 Claims, 9 Drawing Sheets

WORKLOAD PLACEMENT BASED ON THERMAL CONSIDERATIONS

BACKGROUND OF THE INVENTION

A data center may be defined as a location, for instance, a room that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling air across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Data centers are becoming increasingly more densely packed with electronic components to accommodate for ever-increasing computing demands. In addition, the electronic components are becoming more powerful, thereby leading to greater heat dissipation. Examples of such data centers are Internet data centers having server applications that execute in a horizontally scalable topology across hundreds or thousands of commodity servers. The increased scale and power densities associated with the more densely packed data centers typically have a significant impact on the thermal properties of the data centers. As such, effective thermal management is essential for cost-effective and robust operations of the data centers.

SUMMARY OF THE INVENTION

According to an embodiment, the present invention pertains to a method of workload placement among servers. In the method, a workload request is received and a group of servers is selected from a set of servers capable of performing the requested workload. Server workload indexes, which are ratios of temperature rises due to re-circulation load for the servers in the group of servers to temperature rises due to re-circulation load for the set of servers, of the servers in the group of servers are calculated. In addition, the workload is placed on one or more of the servers in the group of servers based upon the server workload indexes of the servers in the group of servers.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

The effectiveness of a server thermal package generally depends on external environmental controls to maintain inlet air temperature within a safe operating range below the "red-line" of approximately 25° C. A variety of factors may cause temperature variations and thermal hot spots in the data center. For instance, non-uniform equipment loads in the data center may cause some areas to have higher temperatures as compared with other areas, while irregular airflows may cause some areas to have lower temperatures than other areas. In data centers having relatively high heat density, for instance, heat dissipation of around 2000 W/m$^2$ (200 W/ft$^2$) or more, mixing of hot and cold streams generally leads to complex airflow patterns that can create hot spots. Hot spots typically create a risk of redlining servers by exceeding the specified maximum inlet air temperature, damaging electronic components and causing them to fail prematurely. In addition, thermal imbalances often interfere with efficient cooling operation.

In one embodiment, thermal imbalances are corrected by incorporating thermal monitoring and workload placement policies into a resource manager. The resource manager is configured to predict thermal load by monitoring the utilization of the server and storage components, and by determining the real-time temperature distribution from variously positioned sensors in the data center. Through the workload placement policies implemented by the resource manager, the servers and storage components in a data center may be operated under a dynamic thermal management scheme designed to enable efficient cooling operation. In one regard, the dynamic thermal management scheme may enable asymmetric workload placement to promote uniform temperature distribution that reduces local hot spots, quickly responds to thermal emergencies, reduces energy consumption costs, reduces initial cooling system capital costs and improves equipment reliability.

Figure 1A:
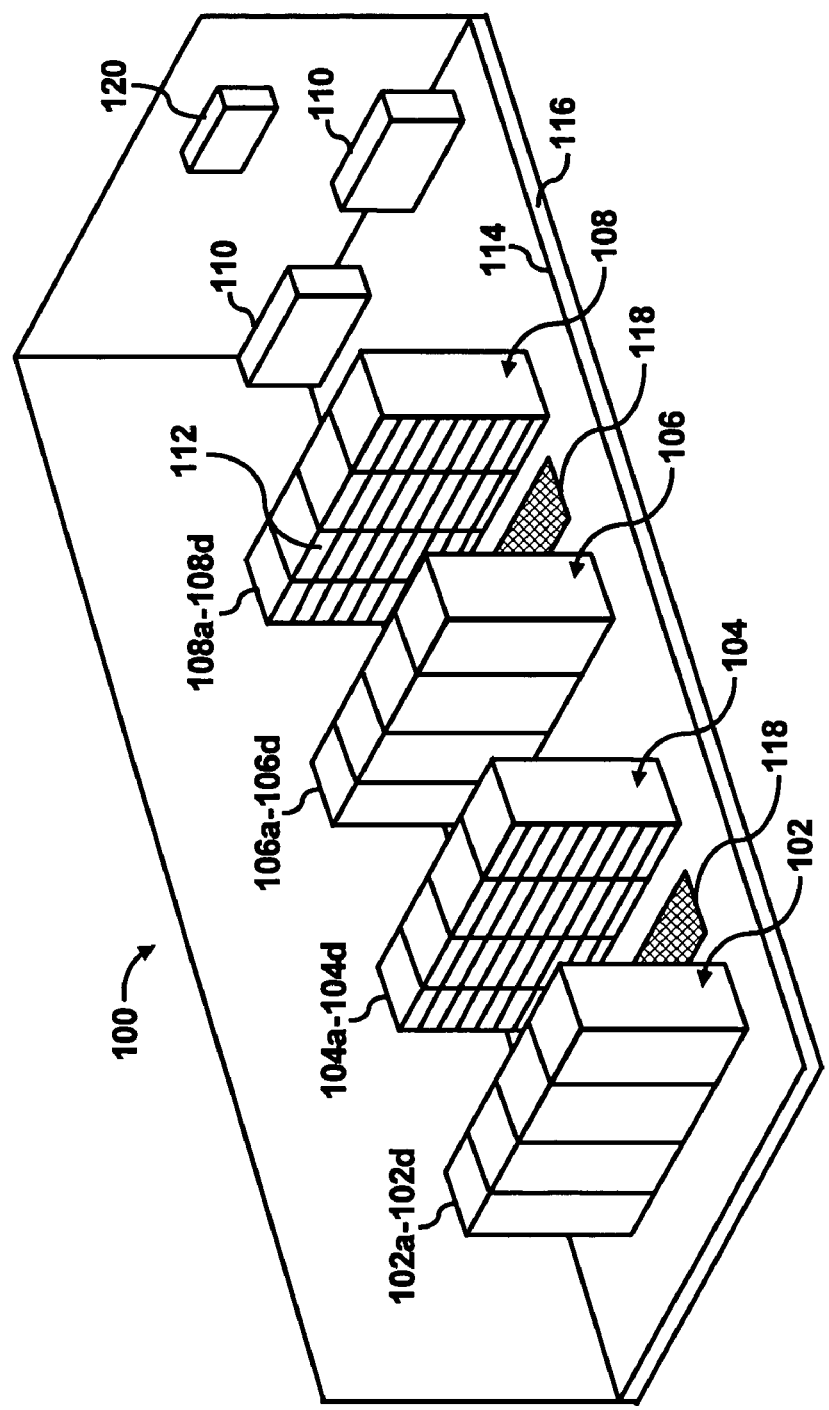
FIG. 1A shows a simplified perspective view of a data center, according to an embodiment of the invention.

With reference first to FIG. 1A, there is shown a simplified perspective view of a data center 100. The terms "data center" are generally meant to denote a room or other space and are not meant to limit the invention to any specific type of room where data is communicated or processed, nor should it be construed that use of the terms "data center" limits the invention in any respect other than its definition hereinabove.

The data center 100 depicted in FIG. 1A represents a generalized illustration and other components may be added or existing components may be removed or modified without departing from the scope of the invention. For example, the data center 100 may include any number of racks and various other apparatuses known to be housed in data centers. Thus, although the data center 100 is illustrated as containing four rows of racks 102-108 and two computer room air conditioning (CRAC) units 110, it should be understood that the data center 100 may include any number of racks, for instance, 100 racks, and CRAC units 110. The depiction of four rows of racks 102-108 and two CRAC units 110 is thus for illustrative and simplicity of description purposes only and is not intended to limit the invention in any respect.

The data center 100 is depicted as having a plurality of racks 102-108, for instance, electronics cabinets, aligned in substantially parallel rows. The racks 102-108 are illustrated as having open front sides such that the components 112 housed therein are visible. It should, however, be understood that embodiments of the invention may be practiced with racks having panels that cover the front sides of the racks 102-108 without departing from a scope of the invention.

The components 112 may comprise, for instance, computers, servers, monitors, hard drives, disk drives, etc., designed to perform various operations, for instance, computing, switching, routing, displaying, etc. These components 112 may comprise subsystems (not shown), for example, processors, micro-controllers, high-speed video cards, memories, semi-conductor devices, and the like to perform these functions. In the performance of these electronic functions, the subsystems and therefore the components 112, generally dissipate relatively large amounts of heat. Because the racks 102-108 have generally been known to include upwards of 200 or more components 112, they may require substantially large amounts of cooling resources to maintain the subsystems and the components 112 generally within predetermined operating temperature ranges.

A relatively small number of components 112 are illustrated as being housed in the racks 102-108 for purposes of simplicity. It should, however, be understood that the racks 102-108 may include any number of components 112, for instance, forty or more components 112, or 200 or more blade systems. In addition, although the racks 102-108 are illustrated as containing components 112 throughout the heights of the racks 102-108, it should be understood that some of the racks 102-108 may include slots or areas that do not include components 112 without departing from the scope of the invention.

The rows of racks 102-108 are shown as containing four racks (a-d) positioned on a raised floor 114. A plurality of wires and communication lines (not shown) may be located in a space 116 beneath the raised floor 114. The space 116 may also function as a plenum for delivery of cooling airflow from the CRAC units 114 to the racks 102-108. The cooled airflow may be delivered from the space 116 to the racks 102-108 through a plurality of vent tiles 118 located between some or all of the racks 102-108. The vent tiles 118 are shown in FIG. 1A as being located between racks 102 and 104 and 106 and 108. One or more temperature sensors (not shown) may also be positioned in the space 116 to detect the temperatures of the airflow supplied by the CRAC units 114.

The CRAC units 114 generally operate to receive heated airflow from the data center 100, cool the heated airflow, and to deliver the cooled airflow into the plenum 116. The CRAC units 114 may comprise vapor-compression type air conditioning units, water-chiller type air conditioning units, etc. In one regard, the CRAC units 114 may operate in manners generally consistent with conventional CRAC units 114. Alternatively, the CRAC units 114 and the vent tiles 118 may be operated to vary characteristics of the cooled airflow delivery as described, for instance, in commonly assigned U.S. Pat. No. 6,574,104, filed on Oct. 5, 2001, which is hereby incorporated by reference in its entirety.

Also illustrated in FIG. 1A is a resource manager 120, depicted as an individual computing device. Although the resource manager 120 is illustrated as being separate from and located away from the racks 102-108, the resource manager 120 may also comprise a server or other computing device housed in one of the racks 102-108. In any regard, the resource manager 120 is generally configured to control various operations in the data center 100. For instance, the resource manager 120 may be configured to control workload placement amongst the various components 112, as described in greater detail herein below. As another example, the resource manager 120 may be configured to control various operations of the CRAC units 114 and the vent tiles 118, collectively considered as the cooling system.

The cooling system also includes a plurality of sensors (not shown) configured to detect at least one environmental condition, for instance, temperature, pressure, humidity, etc. These sensors may comprise any reasonably suitable conventional sensors configured to detect one or more of these environmental conditions. The sensors may be positioned at various locations of the data center 100. The sensors may be positioned, for instance, to detect the temperature of the cooled airflow supplied by the CRAC units 114, the temperatures of the cooling fluid at the inlets of various racks 102-108, the temperatures of the cooling fluid at the outlets of various racks 102-108, etc. The sensors may comprise devices separate from the components 112 or they may comprise devices integrated with the components 112.

Figure 1B:
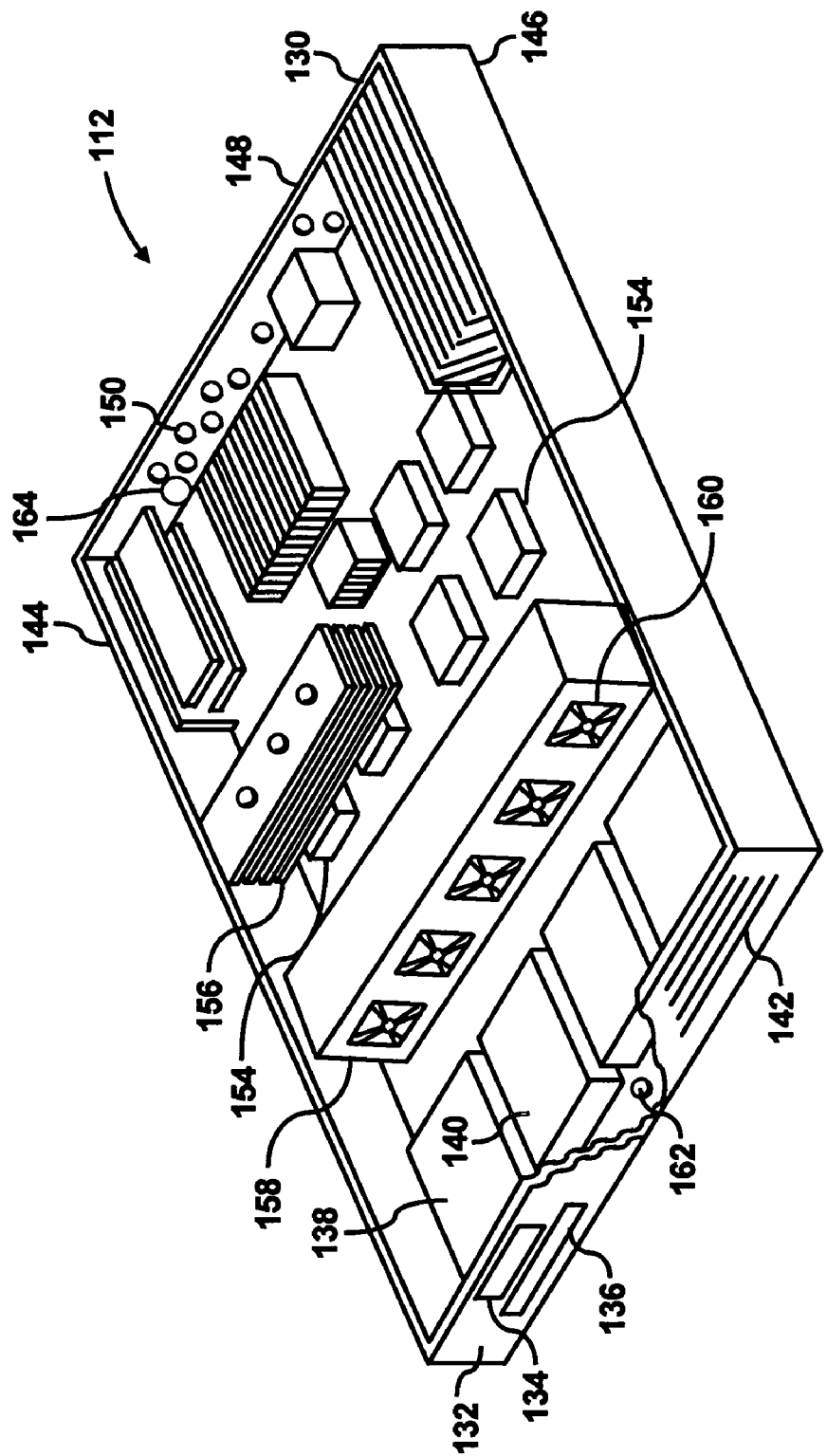
FIG. 1B is a perspective view of a component that may be housed in the racks depicted in FIG. 1A.

FIG. 1B is a perspective view of a component 112 that may be housed in the racks 102-108 depicted in FIG. 1A. The component 112 depicted in FIG. 1B comprises a server that may be mounted in the racks 102-108. In addition, the component 112 may comprise a server that is configured for substantially horizontal mounting in a rack 102-108 or a server that is configured for substantially vertical mounting in a rack 102, 108, such as, a blade system. In any regard, the component 112 represents a generalized illustration and, therefore, other devices and design features may be added or existing devices or design features may be removed, modified, or rearranged without departing from the scope of the invention. For example, the component 112 may include various openings for venting air through an interior of the component 112. As another example, the locations of the various devices shown in the component 112 may be re-positioned.

As shown in FIG. 1B, the component 112 includes a housing 130 with a top section of the housing 130 removed for purposes of illustration. In addition, a part of a front section 132 of the housing 130 has been cut-away to more clearly show some of the devices contained in the component 112. The front section 132 is illustrated as containing various features to enable access to various devices contained in the component 112. For instance, the front section 132 is shown as including openings 134 and 136 for insertion of various media, for example, diskettes, flash memory cards, CD-Roms, etc. Located substantially directly behind the openings 134 and 136 are data storage devices 138 and 140 configured to read and/or write onto the various media. The front section 132 also includes vents 142 for enabling airflow into an interior of the housing 130.

The housing 130 also includes a plurality of side sections 144 and 146 and a rear section 148. The rear section 148 includes openings 150 to generally enable airflow out of the housing 130. Although not clearly shown in FIG. 1B, the rear section 148 also includes openings for insertion of wires, cables, and the like, into the housing 130 for connection to various devices contained in the housing 130. In addition, some of the openings 150 in the rear section 148 may include devices to enable the interfacing of certain devices contained in the housing 130 with various other electronic devices.

Contained within the housing 130 is a plurality of heat-generating devices 154. Some of the heat-generating devices 154 may comprise microprocessors, power converters, memory controllers, power supplies, disk drives, etc. In addition, some of the heat-generating devices 154 may include heat sinks 156 configured to dissipate relatively larger amounts of heat generated by these devices 154 by providing a relatively larger surface area from which heat may be dissipated through convection.

Also illustrated in the component 112 is an optional fan cell 158. The fan cell 158 is considered optional because the additional airflow produced through use of the fan cell 158 may not be required in certain components 112. In any regard, the optional fan cell 158 is depicted as being composed of fans 160 for blowing air through the component 112. The optional fan cell 158 is depicted as containing five fans 160 for illustrative purposes only and may therefore contain any reasonably suitable number of fans, for instance, from 1 to 10 or more fans. The fans 160 contained in the fan cell 158 may comprise relatively low capacity fans or they may comprise high capacity fans that may be operated at low capacity levels. In addition, the fans may have sufficiently small dimensions to enable their placement in the housing 130 without, for instance, substantially interfering with the operations of other devices contained in the component 112. Moreover, the optional fan cell 158 may be positioned at locations in or around the component 112 without departing from a scope of the invention.

The component 112 is also illustrated as including an inlet temperature sensor 162 and an outlet temperature sensor 164. As the names suggest, the inlet temperature sensor 162 is configured to detect the temperature of the airflow entering into the component 112 and the outlet temperature sensor 164 is configured to detect the temperature of the airflow exiting the component 112. The temperature sensors 162 and 164 may comprise any reasonably suitable temperature sensors, such as, thermocouples, thermostats, etc. In addition, the temperature sensors 162 and 164 may be integrally manufactured with the component 112 or the temperature sensors 162 and 164 may be installed in the component 112 as after-market devices.

As will be described in greater detail herein below, the temperature measurements obtained through use of the temperature sensors 162 and 164 may be employed to determine various characteristics of the component 112. More particularly, the resource manager 120 may use these characteristics for workload placement decisions.

Figure 2:
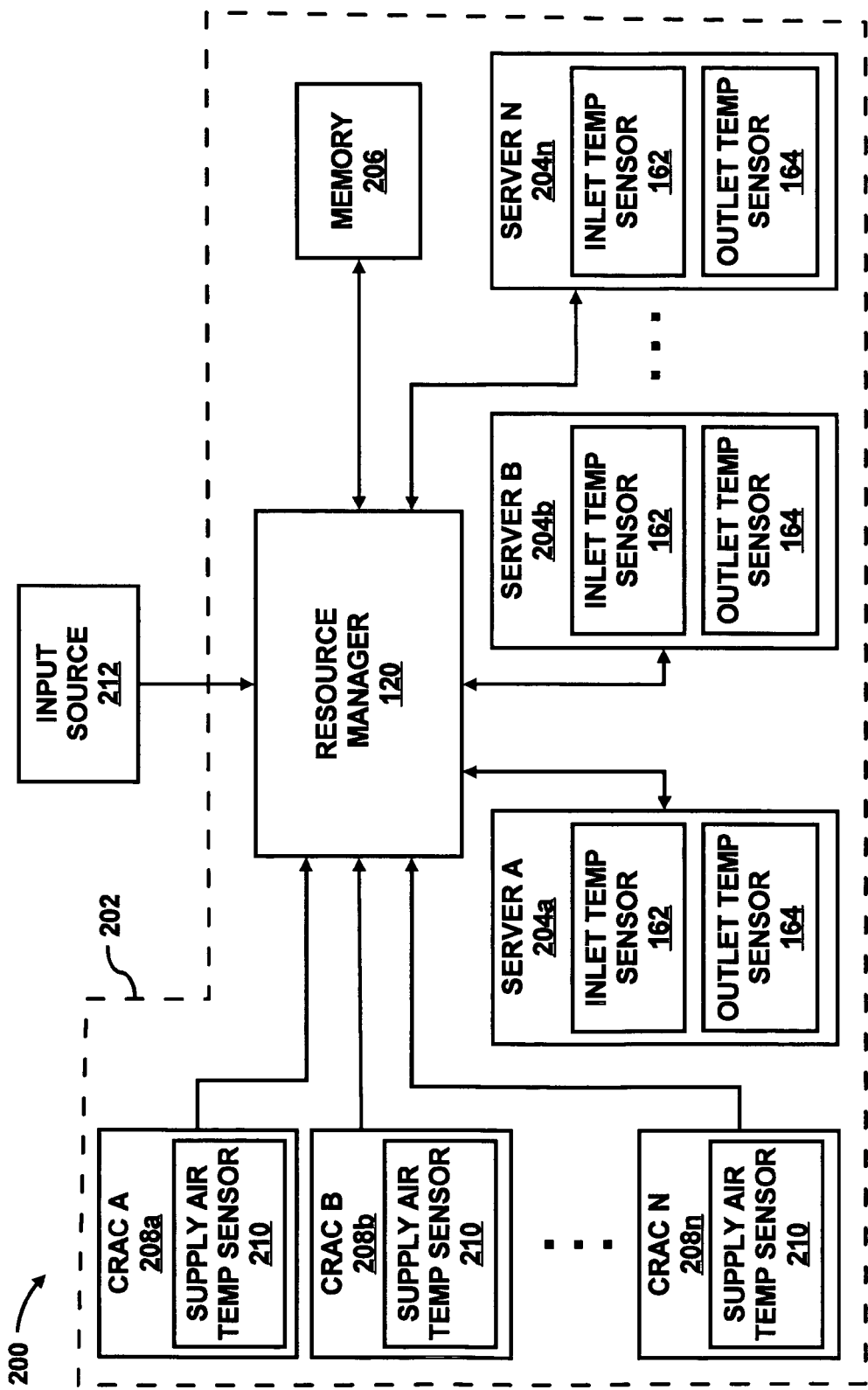
FIG. 2 is a block diagram of a workload placement system according to an embodiment of the invention.

FIG. 2 is a block diagram 200 of a workload placement system 202. It should be understood that the following description of the block diagram 200 is but one manner of a variety of different manners in which such a workload placement system 202 may be configured. In addition, it should be understood that the workload placement system 202 may include additional components and that some of the components described herein may be removed and/or modified without departing from the scope of the invention. For instance, the workload placement system 202 may include any number of sensors, servers, CRAC units, etc., as well as other components, which may be implemented in the operations of the workload placement system 202.

As shown, the workload placement system 202 includes the resource manager 120 depicted in FIG. 1A. As described hereinabove, the resource manager 120 is configured to perform various functions in the data center 100. In this regard, the resource manager 120 may comprise a computing device, for instance, a computer system, a server, etc. In addition, the resource manager 120 may comprise a microprocessor, a micro-controller, an application specific integrated circuit (ASIC), and the like, configured to perform various processing functions. In one respect, the resource manager 120 may comprise a controller of another computing device.

One of the processing functions of the resource manager 120 includes the balancing of workload among a plurality of components 112 based upon thermal considerations. In this regard, the resource manager 120 is configured to receive information from a plurality of components 112 and one or more CRAC units 114. The resource manager 120 is also configured to determine which of the components 112 requested workload is placed based upon the received information.

As shown in FIG. 2, the resource manager 120 is in communication with a plurality of servers (A-N) 204a-204n. The ellipses positioned between server (B) 204b and server (N) 204n generally indicate that the resource manager 120 may be in communication with any reasonably suitable number of servers. In any regard, the servers 204a-204n comprise some of the components 112 depicted in FIG. 1A and the component 112 depicted in FIG. 1B.

Communications between the resource manager 120 and the servers 204a-204n may be effectuated through use of any reasonably suitable known hardware and/or software configured to enable such communications. By way of example, the resource manager 120 and the servers 204a-204n may each include network adaptors (not shown) configured to enable wired or wireless information transfer between the resource manager 120 and the servers 204a-204n. In addition, or alternatively, either or both of the resource manager 120 and the servers 204a-204n may include software designed to enable the information transfer.

The resource manager 120 may receive various types of information from the servers 204a-204n. For instance, the resource manager 120 may receive identifying information of the servers 204a-204n, the locations of the servers 204a-204n, etc. The resource manager 120 may also receive information pertaining to the devices contained in the servers 204a-204n. This information may include, for instance, the types and numbers of processors, data storage capabilities, etc. In addition, or alternatively, the resource manager 120 may access this type of information from a database (not shown) stored, for instance, in a memory 206. The memory 206 may comprise a traditional memory device, such as, volatile or non-volatile memory, such as DRAM, EEPROM, flash memory, combinations thereof, and the like.

The database may include information such as, correlations between the identifications of the servers 204a-204n and the devices contained in the servers 204a-204n, the locations of the servers 204a-204n, etc. A user may program some or all of the information contained in the database. Alternatively, this information may be substantially automatically programmed. For instance, the resource manager 120 or another computing device may automatically update the database when servers 204a-204n are removed, added, moved, or modified.

The resource manager 120 is also in communication with one or more CRAC units (A-N) 208a-208n. The ellipses positioned between CRAC unit (B) 208b and CRAC unit (N) 208n generally indicate that the workload placement system 202 may include any reasonably suitable number of CRAC units. In any regard, the CRAC units 208a-208n comprise one or more of the CRAC units 114 depicted in FIG. 1A. Although the workload placement system 202 is depicted as including three or more CRAC units 208a-208n, the workload placement system 202 may also operate with a single CRAC unit 208a. Thus, it should be appreciated that the depiction of three or more CRAC units 208a-208n is to illustrate and describe certain features of the workload placement system 202 but is not intended to limit the workload placement system 202. In addition, reference is made to the CRAC units 208a-208n for purposes of illustration and not to limit the workload placement system 202 in any respect.

The resource manager 120 and the CRAC units 208a-208n may communicate through use of any reasonably suitable known hardware and/or software configured to enable such communications. By way of example, the resource manager 120 and the CRAC units 208a-208n may each include network adaptors (not shown) configured to enable wired or wireless information transfer between the resource manager 120 and the CRAC units 208a-208n. In addition, or alternatively, either or both of the resource manager 120 and the CRAC units 208a-208n may include software designed to enable the information transfer.

The resource manager 120 may also receive various types of information from the CRAC units 208a-208n. For instance, the resource manager 120 may receive information pertaining to the identifications of the CRAC units 208a-208n, the locations of the CRAC units 208a-208n, etc. The resource manager 120 may also receive information pertaining to the cooling capacities of the CRAC units 208a-208n. The cooling capacities may pertain to, for instance, the operational limits of the CRAC units 208a-208n as rated by the manufacturers of the CRAC units 208a-208n or as determined through testing of the CRAC units 208a-208n. In addition, or alternatively, the resource manager 120 may access this type of information from a database (not shown) stored, for instance, in the memory 206.

The database may include information such as, correlations between the identifications of the CRAC units 208a-208n and their cooling capacities, the locations of the CRAC units 208a-208n, etc. A user may program some or all of the information contained in the database. Alternatively, this information may be substantially automatically programmed. For instance, the resource manager 120 or another computing device may automatically update the database when CRAC units 208a-208n are removed, added, moved, or modified.

As further shown in FIG. 2, the servers 204a-204n contain respective inlet temperature sensors 162 and outlet temperature sensors 164, which may comprise any reasonably suitable temperature sensors, such as, thermocouples, thermostats, etc. As described hereinabove with respect to FIG. 1B, the inlet temperature sensors 162 are configured to detect the respective temperatures of airflow entering into the servers 204a-204n and the outlet temperature sensors 164 are configured to detect the respective temperatures of airflow exiting the servers 204a-204n. The temperature measurements obtained by the inlet temperature sensors 162 and the outlet temperature sensors 164 of the respective servers 204a-204n may be communicated to the resource manager 120.

Temperature measurements obtained by supply air temperature sensors 210 of respective CRAC units 208a-208n may also be communicated to the resource manager 120. The supply air temperature sensors 210 are generally configured to detect the temperatures of the cooled airflow supplied by respective CRAC units 208a-208n. In one respect, the temperature sensors 210 may be included in respective CRAC units 208a-208n and may be positioned to detect the airflow temperatures as the cooled airflow is delivered into the space 116 (FIG. 1A). In another example, the supply air temperature sensors 210 may be positioned in the space 116 to detect the temperatures of the airflow contained in the space 116. As a yet further example, the supply air temperature sensors 210 may be positioned near vent tiles 118 to detect the temperatures of the of the airflow supplied through respective vent tiles 118. In the last example, in order to determine the supply air temperature of various CRAC units 208a-208n, a correlation between the level of influence of the CRAC units 208a-208n on respective ones of the vent tiles 118 may be required to determine the temperature of the airflow supplied by the CRAC units 208a-208n. In addition, an assumption that the airflow temperature has not changed from the time the airflow was delivered into the space 116 and the time the airflow reaches the vent tiles 118 may be required.

The illustration of the supply air temperature sensors 210 forming part of respective is CRAC units 208a-208n is to depict the correlation between the respective CRAC units 208a-208n and sensors configured to detect the temperatures of the airflow supplied by the respective CRAC units 208a-208n. Thus, the supply air temperature sensors 210 should not be construed as necessarily forming part of the CRAC units 208a-208n.

The resource manager 120 may also communicate with an input source 212, which may comprise various types of input sources. For instance, the input source 212 may comprise the Internet, an internal network to which the resource manager 120 is attached, a physical input device (such as a computer system, a keyboard, a mouse, a stylus, etc.), etc. In general, the input source 212 may be defined as any source capable of providing instructions to the resource manager 120. By way of example, the input source 212 may be used as a means to request that the resource manager 120 select a server 204a-204n to perform an application. In certain instances, the request may be transparent to user of the input source 212. For instance, a user may submit a request for performance of a service or application over the Internet and the resource manager 120 may receive and process the request as described below. In any regard, the resource manager 120 may communicate with the input source 212 via an Ethernet-type connection or through a wired protocol, such as IEEE 802.3, etc., or wireless protocols, such as IEEE 802.11b, 802.11g, wireless serial connection, Bluetooth, etc., or combinations thereof.

In terms of processing the request, the resource manager 120 determines and selects a server 204a-204n to perform the requested service or application based substantially upon thermal load balancing considerations. The process by which the resource manager 120 makes this determination is described in greater detail with respect to FIG. 3.

Figure 3A:
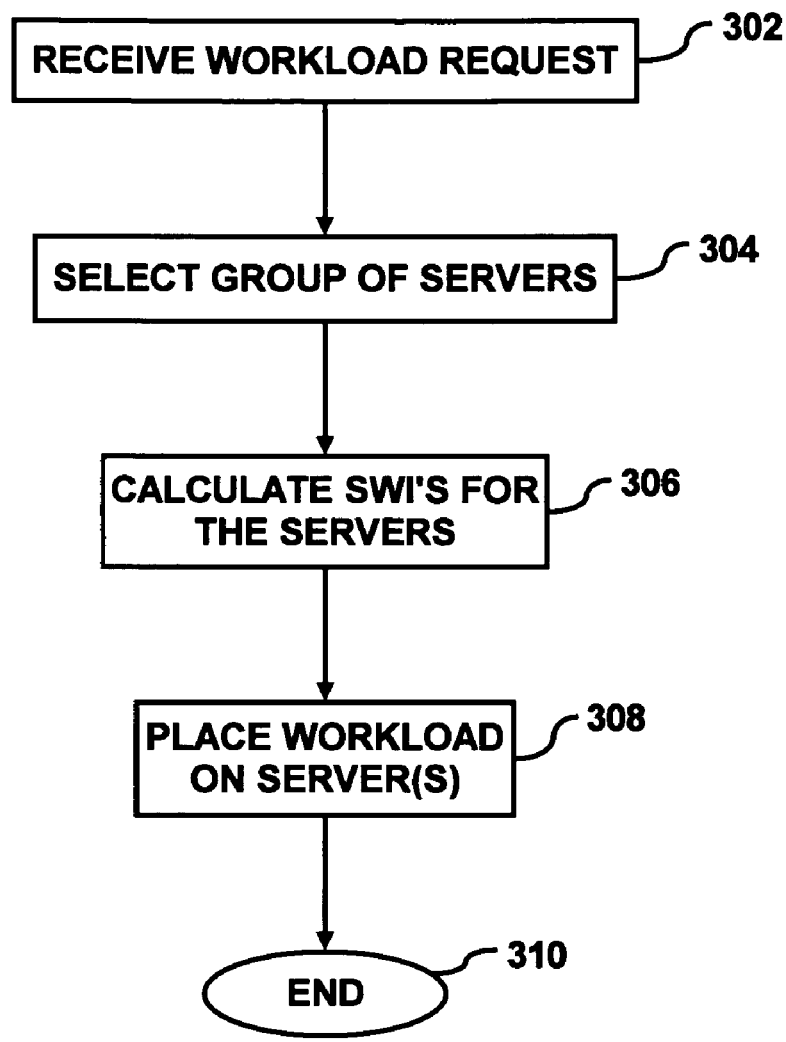
FIG. 3A illustrates a flow diagram of an operational mode of a method for workload placement, according to an embodiment of the invention.

FIG. 3A illustrates a flow diagram of an operational mode 300 of a method for workload placement. It is to be understood that the following description of the operational mode 300 is but one manner of a variety of different manners in which an embodiment of the invention may be practiced. It should also be apparent to those of ordinary skill in the art that the operational mode 300 represents a generalized illustration and that other steps may be added or existing steps may be removed, modified or rearranged without departing from the scope of the invention.

The description of the operational mode 300 is made with reference to the block diagram 200 illustrated in FIG. 2, and thus makes reference to the elements cited therein. It should, however, be understood that the operational mode 300 is not limited to the elements set forth in the block diagram 200. Instead, it should be understood that the operational mode 300 may be practiced by a workload placement system having a different configuration than that set forth in the block diagram 200.

The operational mode 300 may be initiated through receipt of a workload request by the resource manager 120 at step 302. Based upon, for instance, the requirements of the requested workload, the resource manager 120 may select a group of servers 204a-204n that are capable of performing the requested workload, as indicated at step 304. In addition, the resource manager 120 may calculate the server workload indexes (SWI's) for the servers 204a-204n in the selected group of servers 204a-204n. At step 308, the resource manager 120 may place the requested workload on one or more of the servers 204a-204n based upon the calculated SWI's of the servers 204a-204n. Upon placement of the workload, the operational mode 300 may end as indicated at step 310. The end condition may be similar to an idle mode for the operational mode 300 since the operational mode 300 may be re-initiated, for instance, when the resource manager 120 receives another workload request.

Additional details of some of the steps outlined in the operational mode 300 are presented hereinbelow with respect to the operational mode 320 in FIG. 3B.

Figure 3B:
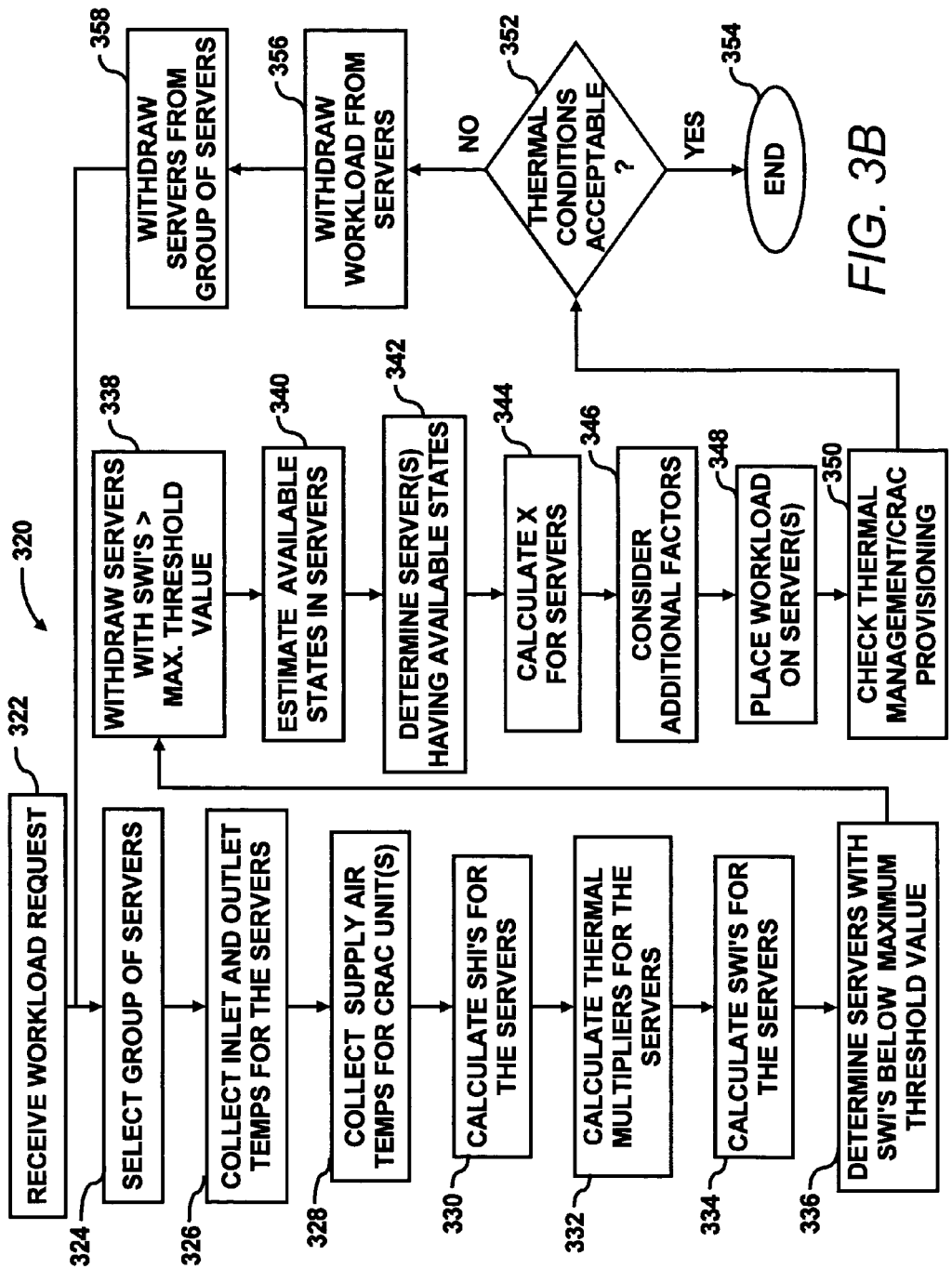
FIG. 3B illustrates a flow diagram of an operational mode of a method for workload placement, according to another embodiment of the invention.

FIG. 3B illustrates a flow diagram of an operational mode 320 of a method for workload placement. It is to be understood that the following description of the operational mode 320 is but one manner of a variety of different manners in which an embodiment of the invention may be practiced. It should also be apparent to those of ordinary skill in the art that the operational mode 320 represents a generalized illustration and that other steps may be added or existing steps may be removed, modified or rearranged without departing from the scope of the invention.

The description of the operational mode 320 is made with reference to the block diagram 200 illustrated in FIG. 2, and thus makes reference to the elements cited therein. It should, however, be understood that the operational mode 320 is not limited to the elements set forth in the block diagram 200. Instead, it should be understood that the operational mode 320 may be practiced by a workload placement system having a different configuration than that set forth in the block diagram 200.

The operational mode 320 may be initiated or started through receipt of a workload request by the resource manager 120, as indicated at step 322. As described hereinabove, the resource manager 120 may receive a workload request from a variety of input sources 212. The workload request may be in the form of a resource specification language (RSL). The RSL may include a description of the services required by a particular application. The resource manager 120 may be configured to determine which specific resources and their quantities are needed to perform the required services of the requested workload, which may be considered as a ground RSL. In one regard, the resource manager 120 may operate to translate the RSL into the ground RSL. By way of example, a workload request may include a request, in RSL, for a portal application with BEA and ORACLE that is configured to serve 100 users per hour. The resource manager 120 may translate this request into ground RSL, which may include an indication that, for instance, 5 rp2450 servers with greater than 1 GB of memory, 12 1 p2000r servers, and 8 DL360's are required to perform that requested workload.

In general, the ground RSL may specify that a certain number of servers 204a-204n having predefined architectures operable to run for a predefined period of time are required to perform a particular workload. Based upon, for instance, the requirements of the requested workload, the resource manager 120 may select a group of servers 204a-204n that are capable of performing the requested workload, as indicated at step 324. For instance, the resource manager 120 may determine which of the servers 204a-204n are equipped with suitable hardware (for instance, memory capacity, processors, etc.) and software (for instance, operating systems, suitable applications, etc.) to perform the requested workload. In selecting the group of servers 204a-204n, the resource manager 120 may also consider additional factors. For instance, the resource manager 120 may determine whether the CRAC unit(s) 110, 208a-208n are near or are exceeding their rated cooling capacities. Thus, the resource manager 120 may exclude servers 204a-204n from the group that are substantially directly cooled by CRAC unit(s) 110, 208a-208n that are operating near or above their rated capacities.

The resource manager 120 may determine the capabilities of the servers 204a-204n either before or after the workload request is received. If the resource manager 120 makes this determination prior to receipt of the workload request, the resource manager 120 may store this information in the memory 208 as described hereinabove.

At step 326, the resource manager 120 may also collect the inlet and outlet temperatures for the servers 204a-204n in the selected group of servers 204a-204n. The temperature information may be obtained from the inlet temperature sensors 162 and the outlet temperature sensors 164 of the respective servers 204a-204n in any of the manners described hereinabove with respect to FIG. 2. In addition, the resource manager 120 may collect the supply air temperatures for one or more CRAC units 110, 208a-208n as indicated at step 328. As also described hereinabove, the supply air temperature(s) may be obtained from supply air temperature sensors 210 of respective CRAC units 110, 208a-208n.

The resource manager 120 may use the collected inlet and outlet temperatures of the servers 208a-208n and the supply air temperatures of the CRAC units 110, 208a-208n to calculate Supply Heat Indexes (SHIs) of the servers 208a-208n at step 330. The SHIs of the servers 208a-208n may be defined as a scalable "indexes of performance" that quantify the amount of re-circulation occurring at the servers 208a-208n. In other words, SHI may act as an indicator of thermal management and energy efficiency of a server 204a-204n.

The SHI of the servers 204a-204n may be used to determine the level, if any, of heated airflow re-circulation into the cooled airflow supplied to the servers 204a-204n. The general concepts of SHI is described in greater detail in commonly assigned U.S. patent application Ser. No. 10/446,854, filed on May 29, 2003, entitled "Air Re-Circulation Index", the disclosure of which is hereby incorporated by reference in its entirety.

Thus, the SHI ($\phi$) of each server 204a-204n in the selected group of servers 204a-204n may be determined through the following equation:

$$\phi = \left[\frac{\delta Q}{Q + \delta Q}\right]_{i,j,k} = \left[\frac{T_{in} - T_{ref}}{T_{out} - T_{ref}}\right]_{i,j,k}, \quad \text{Equation (1)}$$

where $\delta Q$ is the heat load due to hot air infiltration, Q is the actual heat load, and the subscript i,j,k denotes the $k^{th}$ server in the $j^{th}$ rack of the $i^{th}$ row. In addition, $T_{in}$ denotes the inlet temperature and $T_{out}$ denotes the outlet temperature of a server 204a-204n. $T_{ref}$ may denote the supply air temperatures of one or more CRAC units 110, 208a-208n. Alternatively, $T_{ref}$ may denote the temperature of the airflow supplied through one or more vent tiles 118. Thus, the respective SHI's ($\phi$) of the servers 204a-204n may be calculated through application of Equation (1).

At step 332, the resource manager 120 may calculate thermal multipliers ($\theta$), which are used to estimate the relative abilities of the servers 204a-204n to accept new workloads compared to other servers 204a-204n. More particularly, a thermal multiplier ($\theta$) is defined as the ratio of the difference between a server's 204a-204n exhaust temperature ($T_{out}$) and the average air supply temperature ($T_{ref}$) to the difference between the average server 204a-204n exhaust temperature ($\overline{T}_{out}$) and the average air supply temperature ($T_{ref}$). Thus, the thermal multiplier ($\theta$) for each server 204a-204n in the selected group of servers 204a-204n may be determined through the following equation:

$$\theta_{i,j,k} = \left(\frac{\overline{T}_{out} - T_{ref}}{T_{out} - T_{ref}}\right)_{i,j,k}. \quad \text{Equation (2)}$$

The average server 204a-204n exhaust temperature ($\overline{T}_{out}$) may be determined through a plurality of different approaches. In a first approach, the average server 204a-204n exhaust temperature ($\overline{T}_{out}$) is calculated as the arithmetic average of the exhaust temperatures ($T_{out}$) from a group or all of the servers 204a-204n in the data center 100. In another approach, the average server 204a-204n exhaust temperature ($\overline{T}_{out}$) is calculated as a power-weighted average of the exhaust temperatures ($T_{out}$) from a group or all of the servers 204a-204n in the data center 100. In a further approach, the average server 204a-204n exhaust temperature ($\overline{T}_{out}$) is calculated as the median of the exhaust temperature ($T_{out}$) distribution from a group or all of the servers 204a-204 in the data center 100. As a yet further approach, the average server 204a-204n exhaust temperature ($\overline{T}_{out}$) is calculated from the total power consumed by a group or all of the servers 204a-204n and the total airflow delivered at the average air supply temperature ($T_{ref}$). In addition, some of the approaches described hereinabove may be combined to calculate the average server 204a-204n exhaust temperature ($\overline{T}_{out}$).

At step 334, the resource manager 120 may calculate Server Workload Indexes (SWI's) for the servers 204a-204n in the selected group. The SWI for a particular server 204a-204n generally denotes the ratio of temperature rise due to re-circulation load for the server 204a-204n to that due to the average total load, inclusive of $\delta Q$ and Q, among all servers of interest. Thus, the SWI for each server 204a-204n in the selected group of servers 204a-204n may be determined through the following equation:

$$(SWI)_{i,j,k} = \frac{\phi}{\theta} = \left(\frac{T_{in} - T_{ref}}{\overline{T}_{out} - T_{ref}}\right)_{i,j,k} \quad \text{Equation (3)}$$

At step 336, the resource manager 120 may determine which, if any, of the servers 204a-204n have SWI's that are below a maximum threshold value. Servers 204a-204n having SWI's that exceed the maximum threshold value may be deemed as being poorly optimized as compared to the average thermal performance of other servers 204a-204n in the data center 100. Thus, those servers 204a-204n having SWI's above the maximum threshold value may be withdrawn from the selected group of servers 204a-204n.

The maximum threshold value may be set based upon various criteria. For instance, the maximum threshold value may be set to unity or slightly higher. As another example, the maximum threshold value may be prescribed to a value less than unity to thereby further limit the number of servers 204a-204n in the selected group of servers 204a-204n. In essence, the maximum threshold value may be set to generally ensure that the workload is placed in one or more servers 204a-204n having substantially maximized thermal performances.

If none of the servers 204a-204n have SWI's below the maximum threshold value, the cooling in the data center 100 may be considered as being improperly provisioned. In this instance, the provisioning of cooling in the data center 100 may be modified in order to enable better, and more efficient cooling provisioning. For instance, one or more of the CRAC units 110, 208a-208n may be operated to decrease the temperature of the cooled air flow delivered to one or more of the servers 204a-204n. In addition, or alternatively, one or more of the CRAC units 110, 208a-208n may be operated to increase the flow rate at which cooled air is delivered to one or more of the servers 204a-204n. As a further example, one or more vent tiles 118 may be manipulated to vary airflow delivery to one or more of the servers 204a-204n. As a yet further example, the rate and/or area in which heated air is removed from the data center 100 may be increased. In any regard, the manipulation in cooling provisioning may be performed, for instance, as described in U.S. patent application Ser. No. 10/446,854, the disclosure of which is hereby incorporated by reference in its entirety.

In addition, or alternatively, at step 336, the servers 204a-204n may be categorized into different groups (or bins) based upon their SWI's. In one example, the groups or bins may indicate various levels of SWI's. Thus, for instance, a first group may include servers 204a-204n having SWI's between 0.1 and 0.5. A second group may include servers 204a-204n having SWI's between 0.6 and 1.0, a third group may include servers 204a-204n having SWI's between 1.1 and 1.5, and so forth. The SWI levels pertaining to the different groups are for illustrative purposes only and are not meant to limit the categorization of the servers 204a-204n in any respect. Therefore, any reasonably suitable SWI values in any reasonably suitable granularity may be used to categorize the servers 204a-204n.

Also, in this example, instead of determining servers 204a-204n having SWI's below a single maximum threshold value, the resource manager 120 may determine and categorize the servers 204a-204n falling into the various categories. The resource manager 120 may also store the categories into which the servers 204a-204n are grouped. Thus, at step 336, the resource manager 120 may determine which of the servers 204a-204n belong to one or more groups having predetermined SWI threshold values. In addition, the resource manager 120 may withdraw from consideration those servers 204a-204n that are not in the selected one or more groups at step 338.

In addition, or alternatively, at step 338, the resource manager 120 may withdraw from consideration those servers 204a-204n having SWI's above the maximum threshold value. For the remaining servers 204a-204n, or the servers 204a-204n in the selected one or more groups, the resource manager 120 may estimate the available states of the servers 204a-204n, as indicated at step 340. The resource manager 120 may estimate the number of available states (Δm) for workload placement in the servers 204a-204n based on thermo-fluids policies through the following equation:

$$\Delta m_{i,j,k} = \text{int}[[1-SWI](N-m)]_{i,j,k}, \quad \text{Equation (4)}$$

where N is the number of states of the $k^{th}$ server in the $j^{th}$ rack of the $i^{th}$ row and m is the number of states being utilized by that server 204a-204n. The number of states N may be based upon the number of processors or Advance Configuration and Power Interfaces (ACPI's). Those servers 204a-204n having larger numbers of available states (Δm) may be viewed as being able to accept the workload with lesser impacts on thermo-fluids policies.

The resource manager 120 may determine which of the servers 204a-204n has sufficient available states to perform the requested workload at step 342. For those servers 204a-204n having sufficient available states, the resource manager 120 may calculate a placement factor X for the servers 204a-204n at step 344. The placement factor X may be determined through the following equation:

$$X_{i,j,k} = SHI_{i,j,k} - SWI_{i,j,k}. \quad \text{Equation (5)}$$

Those servers 204a-204n having larger positive values of X are considered as being more desirable for workload placement. In contrast, those servers 204a-204n having larger negative values of X are considered as being less desirable for workload placement. In this regard, the resource manager 120 may select to place the workload on those servers 204a-204n having larger positive values of X prior to placing the workload on those servers 204a-204n having larger negative values of X. In addition, the resource manager 120 may compare the placement factor X values against one or more predetermined threshold values in categorizing the placement factor X values of the servers 204a-204n. Thus, for instance, servers 204a-204n having X values above a first predetermined threshold value may be categorized into one group, servers 204a-204n having X values above a second predetermined threshold value may be categorized into a second group, and so on. The resource manager 120 may assess the desirability of workload placement among the servers 204a-204n based upon the group in which the servers 204a-204n are categorized.

At step 346, the resource manager 120 may consider additional factors in selecting which of the servers 204a-204n to place the requested workload. The additional factors may include, for instance, the terms contained in a Service Level Agreement, security levels of the servers 204a-204n, processor speeds, etc. The resource manager 120 may thus determine which of the servers 204a-204n meets the various criteria of the additional factors at step 346.

At step 348, the resource manager 120 may place the requested workload on one or more of the qualifying servers 204a-204n. The number of servers 204a-204n selected to perform the requested workload may, for instance, correspond to the number of servers 204a-204n required to perform the requested workload.

In addition, the workload placement step 348 may be performed in a number of different manners. In one example, the workload placement may be sequentially deployed. In this example, the resource manager 120 may determine the locations of the qualifying servers 204a-204n and place a portion of the workload on qualifying servers 204a-204n that are in relatively closely located groups. For instance, the resource manager 120 may place a portion of the workload in a group of servers 204a-204n having relatively large positive values of X, or those servers 204a-204n in a certain group, that meet the criteria set forth at step 326. In addition, the resource manager 120 may perform steps 350-358 as described hereinbelow to assess the impact of the workload placement and to adjust for negative impacts. The resource manager 120 may also repeat, for instance, steps 324-358 until all of the workload has been placed. The sequential placement of the workload generally enables the workload to be placed while reducing adverse thermal effects that may be caused through placement of the workload.

In another example, the resource manager 120 may place the workload on servers 204a-204n having relatively large positive values of X, or those servers 204a-204n in a certain group, regardless of their locations. Steps 350-358, as described hereinbelow, may also be performed to assess the impact of the workload placement and adjustments may be made.

Although the operational mode 320 may end following placement of the workload, the resource manager 120 may optionally check thermal management of the data center 100 based upon the placed workload, as indicated at step 350. At step 350, the resource manager 120 may determine whether the workload placement has caused thermal conditions in the data center 100 to fall outside of acceptable levels, as indicated at step 352. By way of example, the resource manager 120 may calculate the SHI of data center 100 as described in U.S. patent application Ser. No. 10/446,854. As another example, the resource manager 120 may calculate the SHI's and/or the SWI's of the servers 204a-204n that received the workload placement to determine whether the added workload has caused the SWI's of those servers 204a-204n to exceed the maximum threshold value. The resource manager 120 may also calculate the SHI's and/or the SWI's of one or more of the servers 204a-204n, either including or excluding those servers 204a-204n to assess the influence of the workload placement on the various servers 204a-204n. As a yet further example, the resource manager 120 may determine whether any of the CRAC units 110, 208a-208n are operating at levels higher than their rated capacities.

In any respect, if the thermal conditions are acceptable at step 352, and all of the workload has been placed, the operational mode 320 may end as indicated at step 354. The end condition may be similar to an idle mode for the operational mode 320 since the operational mode 320 may be re-initiated, for instance, when the resource manager 120 receives another workload request.

If, however, the thermal conditions are not acceptable at step 352, the resource manager 120 may withdraw the workload from the servers 204a-204n where the workload was placed, as indicated at step 356. The resource manager 120 may also withdraw these servers 204a-204n from the group of selected servers (step 304) at step 358. In addition, the resource manager 120 may perform steps 324-358 on a substantially continuous basis, until the workload has been placed and the thermal conditions resulting from the placement are acceptable.

In addition, or alternatively, if the servers 204a-204n were categorized into different groups according to their SWI's at step 336, those servers 204a-204n may be withdrawn from their respective groups at step 358. The remaining servers 204a-204n in the one or more groups from which those servers 204a-204n were withdrawn may first be considered to receive the workload. In this regard, for instance, steps 340-358 may be repeated for those servers 204a-204n remaining in the one or more groups. Moreover, steps 340-358 may be repeated until all of the workload has been placed.

Figure 3C:
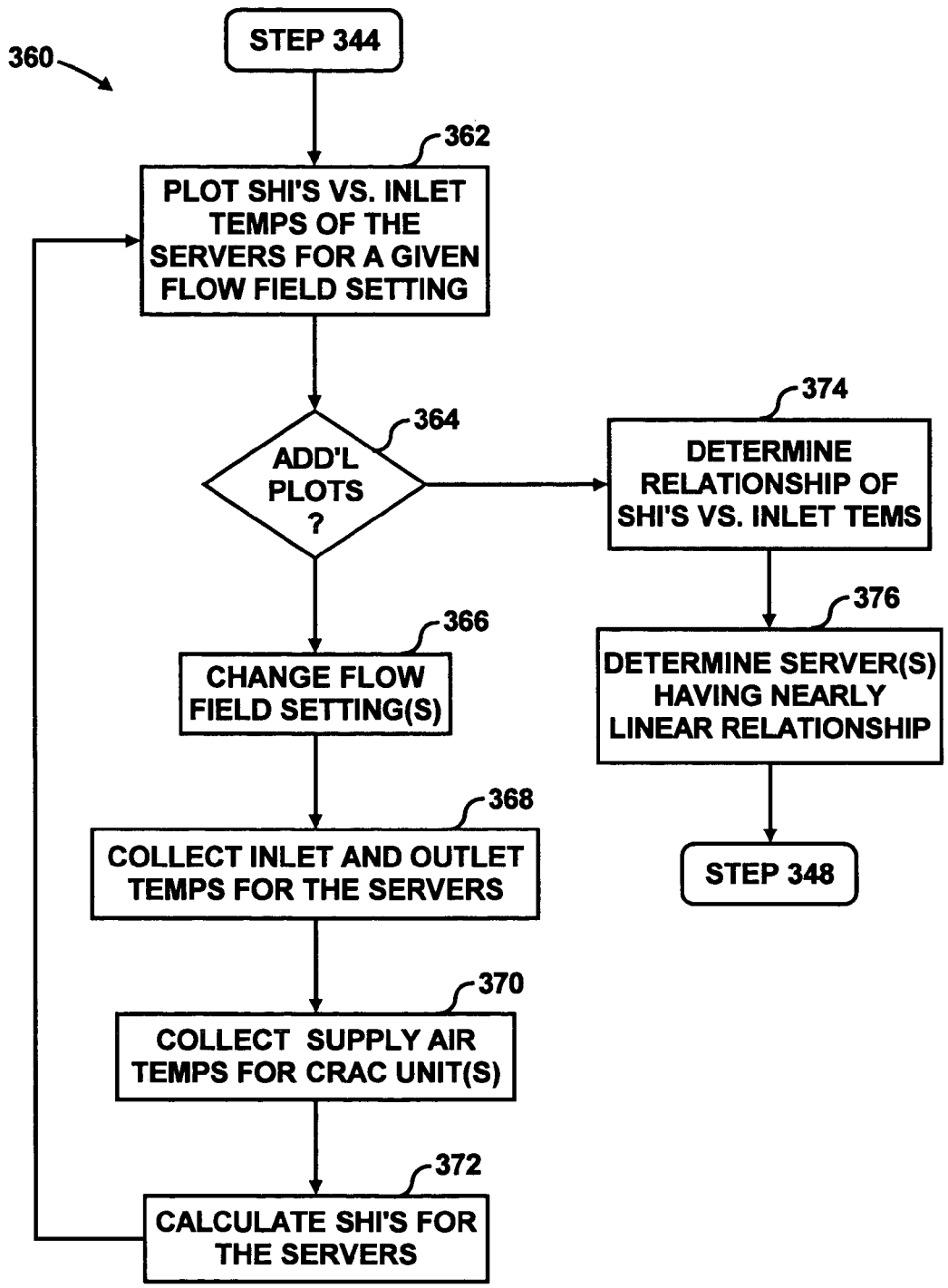
FIG. 3C depicts an optional operational mode that may be performed during the additional factor consideration step illustrated in FIG. 3B.

The description of FIG. 3B is for illustrative purposes and additional steps may be added without departing from a scope of the operational mode 320. For instance, FIG. 3C depicts an optional operational mode 360 that may be performed during the additional factor consideration step 344. More particularly, the optional operational mode 360 may be performed to characterize the airflow characteristics of the servers 204a-204n, which may be used to further refine selection of the servers 204a-204n to perform the requested workload.

With particular reference now to the operational mode 360, following the step of calculating the SHI–SWI's for the servers 204a-204n (step 344), the resource manager 120 may create a plot of the SHI's of the servers 204a-204n vs. the inlet temperatures of the servers 204a-204n for a given flow field setting, as indicated at step 362. The flow field settings may include, for instance, the volume flow rates of one or more CRAC units 110, 208a-208n, the airflow characteristics through one or more vent tiles 118, the positions of adjustable panels or adjustable louvers configured to vary airflow into individual racks, the speeds of rack-mounted fans, etc. As will be described in greater detail hereinbelow, the plot of SHI vs. inlet temperatures may be used to determine how the indices vary with different flow field settings. In addition, the plotted relationships are examined to determine whether a linear relationship exists. Depending upon the linearity, or lack of linearity, it may be determined as to whether airflow characteristics through the servers 204a-204n are substantially optimized.

At step 364, the resource manager 120 may determine whether additional plots should be obtained. If additional plots are to be obtained, the resource manager 120 or another controlling device (not shown) may control or otherwise cause one or more flow field settings to be changed at step 366. The flow field settings may include the volume flow rates of one or more CRAC units 110, 208a-208n, the airflow characteristics through one or more vent tiles 118, etc. The adjustable panels may include those described in co-pending and commonly assigned U.S. patent application Ser. No. 10/425,624, and the adjustable louvers may include those described in co-pending and commonly assigned U.S. patent application Ser. No. 10/425,621, both of which were filed on Apr. 30, 2003. In addition, the disclosures of these applications are incorporated herein by reference in their entireties.

The changes to airflow characteristics through one or more vent tiles 118 may be performed either manually or through use of computer controlled vent tiles. An example of computer controlled vent tiles may be found in commonly assigned U.S. Pat. No. 6,574,104, the disclosure of which is incorporated herein by reference in its entirety. In addition, the resource manager 120 may collect the inlet and outlet temperatures for the servers 204a-204n at the varied flow field settings, as indicated at step 368. The resource manager 120 may also collect the supply air temperatures for one or more CRAC units 110, 208a-208n, as indicated at step 370. Based upon the temperature information obtained at steps 368 and 370, the resource manager 120 may calculate the SHI values of the servers 204a-204n through use of Equation (1), as indicated at step 372.

Figure 4A:
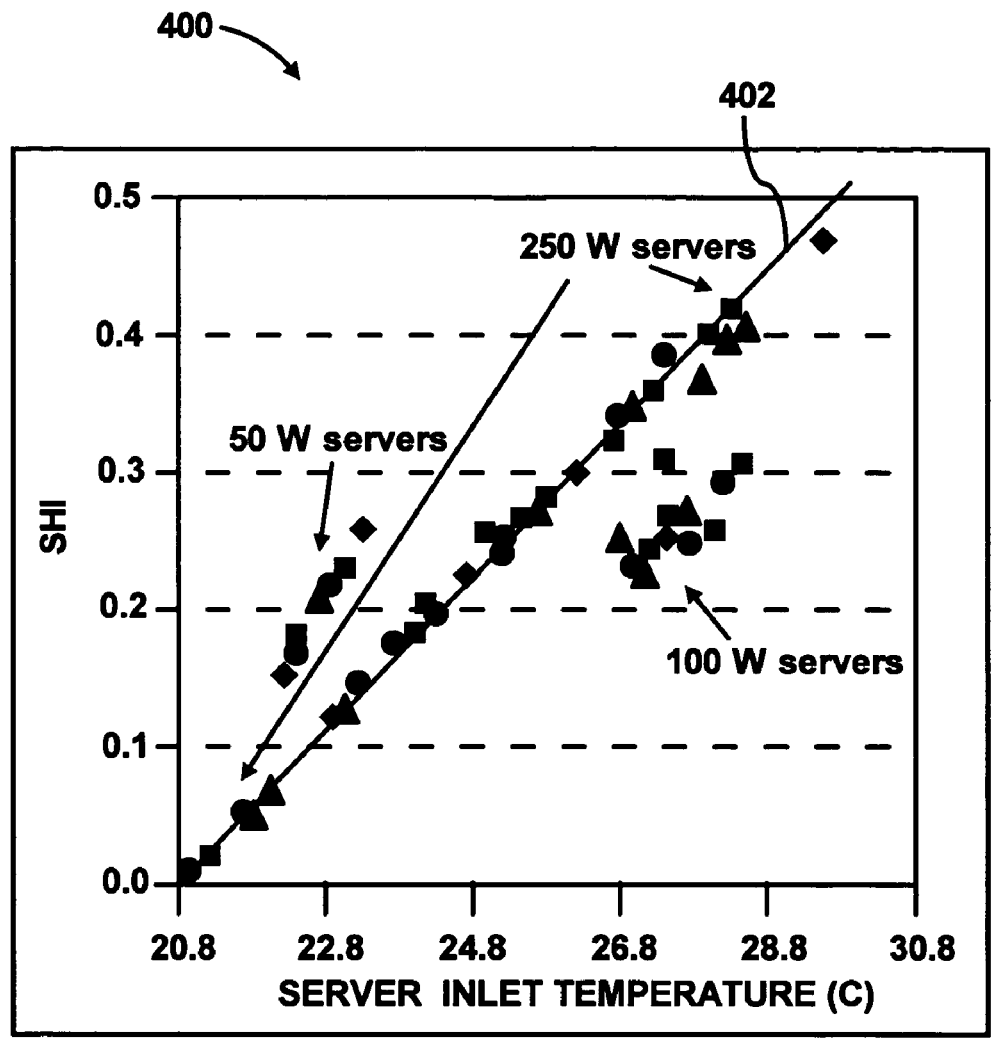
FIG. 4A shows a graph of a variation of SHI and server inlet temperatures for various servers at different flow field settings, according to an embodiment of the invention.
Figure 4B:
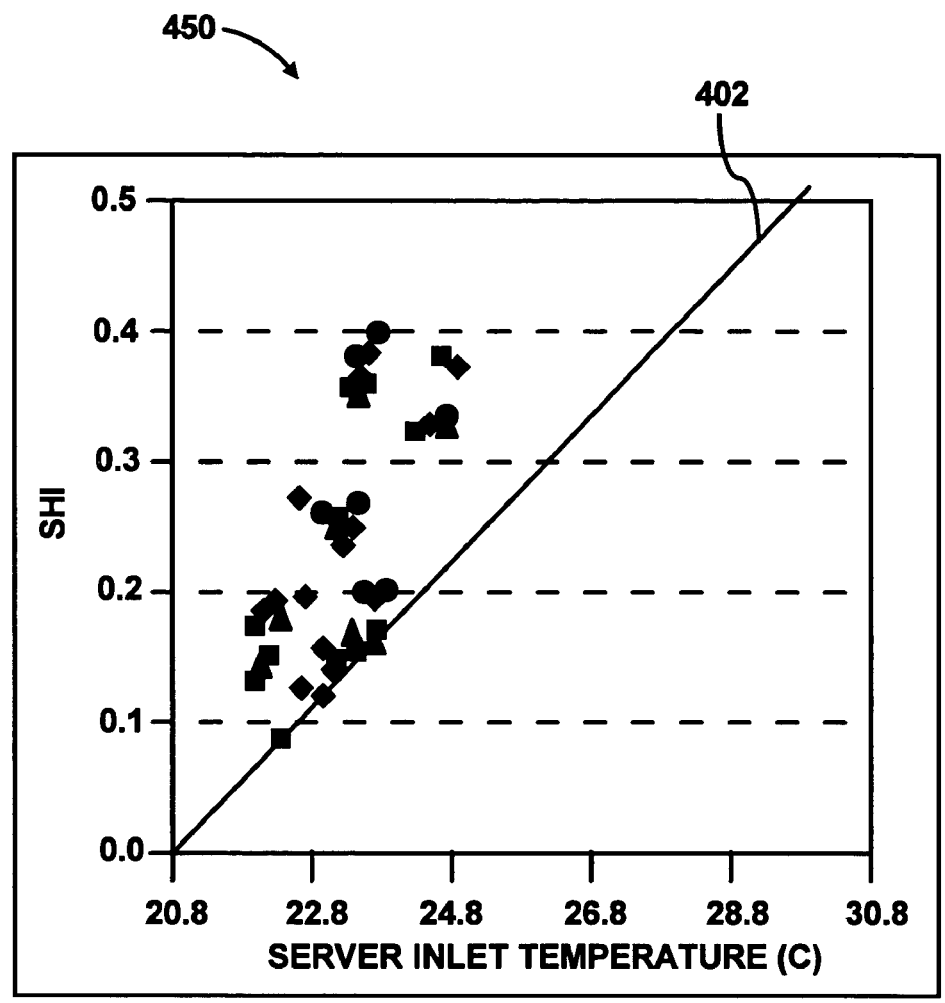
FIG. 4B shows a graph similar to FIG. 4A having different plots of SHI and server inlet temperatures, according to an embodiment of the invention.

The calculated SHI values and the inlet temperatures may again be plotted at step 362. In addition, steps 362-372 may be repeated for the various flow field settings. FIGS. 4A and 4B illustrate examples of respective graphs 400 and 450 that may be generated by the resource manager 120 based upon the SHI values and the inlet temperature values for various servers 204a-204n at various flow field settings.

When the re-circulation heat load caused by hot air infiltration ($\delta Q$) is negligible compared to the actual heat loads (Q), Equation (1) may be reduced to a linear equation in SHI, as follows:

$$SHI_{i,j,k} = \left( \frac{T_{in} - T_{ref}}{(T_{out} - T_{in}) + (T_{in} - T_{ref})} \right) \quad \text{Equation (6)}$$

$$\approx \frac{\delta Q}{Q}$$

$$= \frac{T_{in} - T_{ref}}{X_{i,j,k}},$$

Where: $Q_{i,j,k} = mC_p(T_{out} - T_{in})$, and  Equation (7)

$\delta Q_i = mC_p(T_{in} - T_{ref})$.  Equation (8)

Where m is the mass flow rate through the server 204a-204n, $C_p$ is the specific heat capacity of the air supplied to the server 204a-204n, and ($T_{in}$) and ($T_{out}$) are the inlet and outlet temperatures of the server 204a-204n. In addition, $X_{i,j,k}=(T_{out}-T_{in})$ denotes the temperature difference due to actual heat load of the $k^{th}$ server in the $j^{th}$ rack of the $i^{th}$ row. FIG. 4A shows the variation of SHI based upon Equation (1) with server 204a-204n inlet temperatures for various servers 204a-204n at different flow field settings. The linear dependence of the plots in FIG. 4A follows the relationship shown in Equation (6), thereby indicating that the re-circulation heat load ($\delta Q$) is negligible relative to the actual heat loads (Q) in the servers 204a-204n.

The plots depicted in the graphs 400 and 450 are for illustrative purposes only and are not meant to limit the invention in any respect. For the plots in graphs 400 and 450, the servers 204a-204n were held under constant heat loads at various flow field settings. In addition, a reference straight line 402 is illustrated to show, for instance, that the SHI vs. inlet temperature plots for the serves 204a-204n having 250 W heat loads is nearly linear in the graph 400. More particularly, at the various flow field settings as indicated by the different symbols, the SHI values vs. the inlet temperatures are nearly linear for the servers 204a-204n.

The graphs 400 and 450 show respective relationships between SHI values and server inlet temperatures for a plurality of servers 204a-204n at various flow field settings. Each of the different symbols represents a different flow field setting. In addition, each of the symbols may represent one or more servers 204a-204n at the different flow field settings. Thus, for instance, one circle in the graph 400 may represent a first server or servers and another circle may represent a second server or servers at a first flow field setting. In addition, a square may represent the first server(s) and another square may represent the second server(s) at a second flow field setting.

In comparing the graphs 400 and 450, it is clearly evident that the plots in graph 400 are nearly linear whereas the plots in graph 450 are not arranged in a linear relationship. Thus, the graph 450 generally denotes that the re-circulation heat load caused by hot air infiltration (δQ) is significant compared to the actual heat loads (Q). Therefore, the graph 450 generally indicates that there may be adverse airflow patterns through the servers 204a-204n which may lead to, for instance, inefficient heat removal from the servers 204a-204n.

Referring back to FIG. 3C, and particularly to step 364, if no additional plots are to be obtained, for instance, a predetermined number of SHI and inlet temperature values have been obtained, the graph, for instance, as illustrated in the graphs 400 and 450, may be analyzed to determine the relationships between the SHI values and the inlet temperatures at step 374. As shown in FIG. 4A, the plots of the SHI values and the inlet temperatures for various servers 204a-204n at various flow field settings are nearly linear for servers 204a-204n having different heat loads. Thus, linearity may be determined through a visual inspection of the graph.

Alternatively, the degree of linearity among the plots may be computed according to the square of the correlation coefficient (R). The correlation coefficient (R) defines the degree of linear relationship between variables measured from an original data and can range from 0, which is completely non-linear to 1, which is completely linear. Based upon the plots in the graph, either graph 400 or 450, a correlation coefficient may be calculated. In addition, an error factor may be considered in determining whether the plots are nearly linear. Thus, for instance, even if the square of the correlation coefficient (R) does not equal 1, if it is nearly equal to one, for instance, if $R^2 > 0.9$, the plots may be considered as being nearly linear. The determination of the acceptable level of deviation from $R^2=1$ while still considering the plots to be nearly linear may be based upon a number of factors.

By way of example, a relatively arbitrary correlation coefficient, for instance, 0.9, may be selected as a lower boundary for considering the plots as being nearly linear. As another example, the lower boundary for the correlation coefficient may be determined through testing configured to indicate correlations between acceptable SHI levels and correlation coefficients. As a further example, the lower boundary for the correlation coefficient may be based upon known uncertainties in the determination of the SHI values inputted into the graph. In this example, for instance, the degree of uncertainty in measuring one or more of the inlet temperatures, the outlet temperatures, and the supply air temperatures may be used to determine the lower boundary for the correlation coefficient.

Regardless of the manner in which the lower boundary for the correlation coefficient is defined, the correlation coefficients for plots obtained for various locations in the data center 100 need not be the same for the various locations.

At step 376, the resource manager 120 may determine which of the servers 204a-204n have SHI's vs. inlet temperatures relationships that are nearly linear. In addition, the resource manager 120 may place the requested workload on one or more servers 204a-204n having the nearly linear relationships, as indicated at step 348. Moreover, the steps following step 348 may be performed as described hereinabove with respect to FIG. 3B.

The operations set forth in the operational modes 300, 320, and 360 may be contained as a utility, program, or subprogram, in any desired computer accessible medium. In addition, the operational modes 300, 320, and 360 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
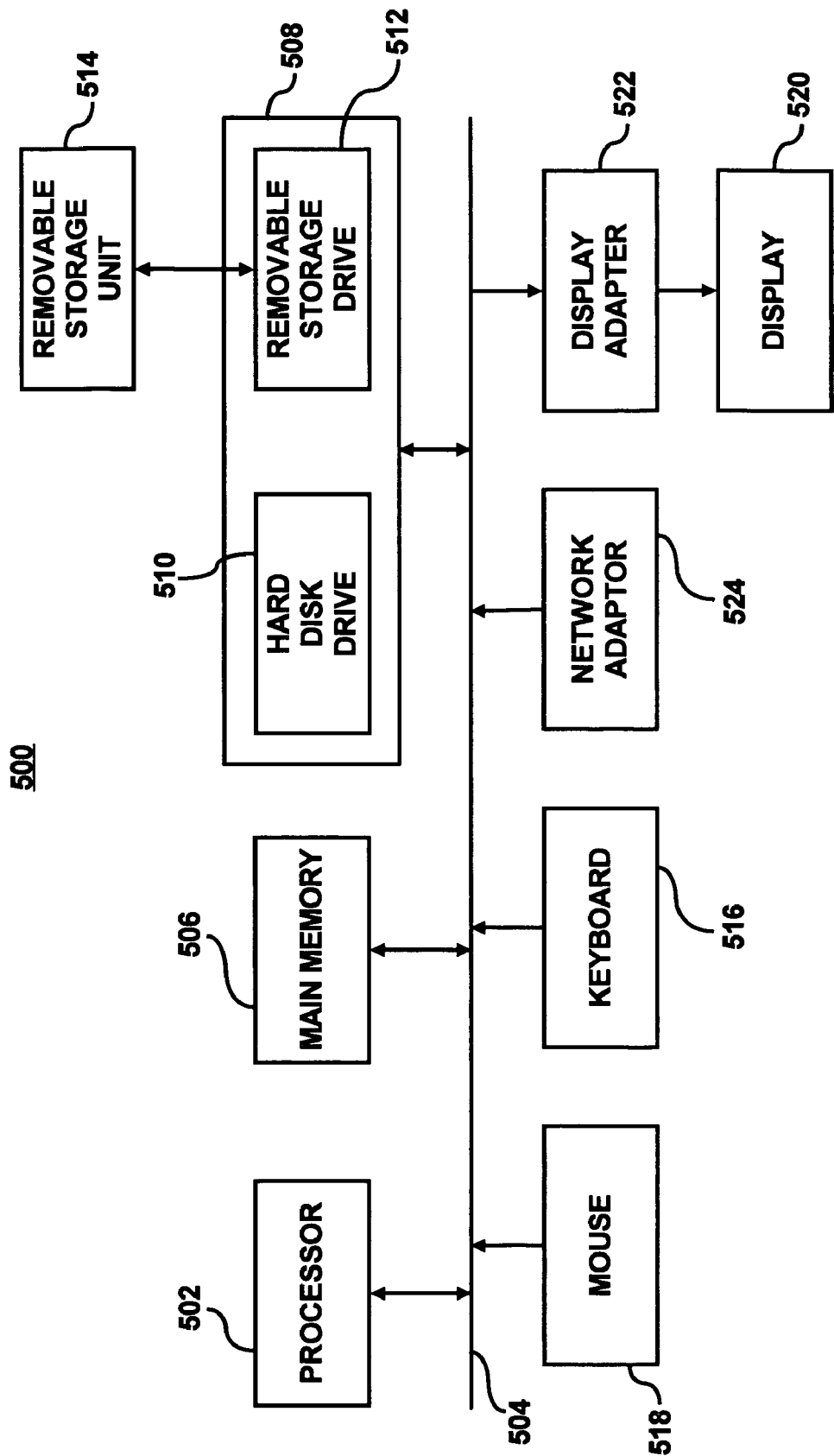
FIG. 5 illustrates a computer system, which may be employed to perform the various functions of the workload placement system, according to an embodiment of the invention.

FIG. 5 illustrates a computer system 500, which may be employed to perform the various functions of the resource manager 120 described hereinabove, according to an embodiment. In this respect, the computer system 500 may be used as a platform for executing one or more of the functions described hereinabove with respect to the resource manager 120.

The computer system 500 includes one or more controllers, such as a processor 502. The processor 502 may be used to execute some or all of the steps described in the operational modes 300, 320, and 360. Commands and data from the processor 502 are communicated over a communication bus 504. The computer system 500 also includes a main memory 506, such as a random access memory (RAM), where the program code for, for instance, the resource manager 120, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the provisioning system may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of workload placement among servers, said method comprising:
   receiving a workload request;
   selecting a group of servers from a set of servers capable of performing the requested workload;
   calculating server workload indexes of the servers in the group of servers, wherein the server workload indexes comprise ratios of temperature rises due to re-circulation load for the servers in the group of servers to temperature rises due to re-circulation load for the set of servers; and
   placing the workload on one or more of the servers in the group of servers based upon the server workload indexes of the servers in the group of servers.

2. The method according to claim 1, further comprising:
   collecting inlet and outlet temperatures of the servers in the group of servers;
   collecting supply air temperatures for one or more CRAC units;
   calculating supply heat indexes ($\phi$) of the servers in the group of servers based upon the collected inlet and outlet temperatures and the supply air temperatures;
   calculating thermal multipliers ($\theta$) for the servers in the group of servers, wherein the thermal multipliers are operable to estimate the relative abilities of the servers in the group of servers to accept new workloads compared to the servers in the set of servers; and
   wherein the step of calculating server workload indexes comprises using the supply heat indexes to calculate the server workload indexes.

3. The method according to claim 2, wherein the step of calculating supply heat indexes comprises calculating supply heat indexes ($\phi$) of the servers in the group of servers based upon the following equation:

$$\phi = \left[\frac{\delta Q}{Q + \delta Q}\right]_{i,j,k} = \left[\frac{T_{in} - T_{ref}}{T_{out} - T_{ref}}\right]_{i,j,k},$$

where $\delta Q$ is the heat load due to hot air infiltration, Q is the actual heat load, the subscript i,j,k denotes the $k^{th}$ server in the $j^{th}$ rack of the $i^{th}$ row, $T_{in}$ denotes the inlet temperature and $T_{out}$ denotes the outlet temperature of each server in the group of servers, and $T_{ref}$ denotes the supply air temperatures of the one or more CRAC units.

4. The method according to claim 2, wherein the step of calculating thermal multipliers ($\theta$) comprises calculating thermal multipliers ($\theta$) of the servers in the group of servers based upon the following equation:

$$\theta_{i,j,k} = \left(\frac{\overline{T}_{out} - T_{ref}}{T_{out} - T_{ref}}\right)_{i,j,k},$$

where the subscript i,j,k denotes the $k^{th}$ server in the $j^{th}$ rack of the $i^{th}$ row, $T_{in}$ denotes the inlet temperature of each server in the group of servers, $\overline{T}_{out}$ denotes an average server exhaust temperature of the set of servers, and $T_{ref}$ denotes the supply air temperatures of the one or more CRAC units.

5. The method according to claim 2, wherein the step of calculating server workload indexes (SWI) comprises calculating server workload indexes (SWI) of the servers in the group of servers based upon the following equation:

$$(SWI)_{i,j,k} = \frac{\phi}{\theta} = \left(\frac{(T_{in} - T_{ref})}{(\overline{T}_{out} - T_{ref})}\right)_{i,j,k},$$

where the subscript i,j,k denotes the $k^{th}$ server in the $j^{th}$ rack of the $i^{th}$ row, $T_{in}$ denotes the inlet temperature of each server in the group of servers, $\overline{T}_{out}$ denotes an average server exhaust temperature of the set of servers, and $T_{ref}$ denotes the supply air temperatures of the one or more CRAC units.

6. The method according to claim 1, further comprising:
   determining which of the servers in the group of servers have server workload indexes that fall below a predetermined maximum threshold value;
   withdrawing the servers from the group of servers having server workload indexes that exceed the predetermined maximum threshold value;
   estimating available states ($\Delta m$) to perform the workload in the servers remaining in the group of servers;
   determining which of the remaining servers have the available states; and
   wherein the step of placing the workload on one or more of the servers comprises placing the workload on one or more servers having the available states.

7. The method according to claim 6, wherein the step of estimating available states comprising estimating available states ($\Delta m$) based upon the following equation:

$$\Delta m_{i,j,k} = \text{int}[[1-SWI](N-m)]_{i,j,k},$$

where the subscript i,j,k denotes the $k^{th}$ server in the $j^{th}$ rack of the $i^{th}$ row, SWI is the server workload index, N is the number of states in a server, and m is the number of states being utilized by the server.

8. The method according to claim 6, further comprising:
   calculating placement factors for the one or more servers having the available states, wherein the placement factors (X) for each of the one or more servers is determined according to the following equation:

$$X_{i,j,k} = SHI_{i,j,k} - SWI_{i,j,k},$$

where the subscript i,j,k denotes the $k^{th}$ server in the $j^{th}$ rack of the $i^{th}$ row, SHI is a supply heat index and SWI is the server workload index; and
   wherein the step of placing the workload further comprises placing the workload on one or more of the servers having relatively high positive values of X.

9. The method according to claim 6, wherein the step of placing the workload further comprises placing a portion of the workload on one or more servers in close proximity to one another, said method further comprising:
   assessing an impact on thermal conditions based upon the workload placement; and
   placing another portion of the workload on the one or more servers in close proximity to one another in response to the impact on thermal conditions being acceptable.

10. The method according to claim 6, wherein the step of placing the workload further comprises placing a portion of the workload on one or more servers in close proximity to one another, said method further comprising:
assessing an impact on thermal conditions based upon the workload placement;
withdrawing the portion of the workload from the one or more servers;
selecting another group of servers;
calculating server workload indexes of the servers in the another group of servers; and
placing the workload on one or more of the servers in the another group of servers based upon the server workload indexes of the servers in the another group of servers.

11. The method according to claim 6, further comprising:
considering additional factors in selecting the workload placement prior to the step of placing the workload, wherein the additional factors comprises one or more of speeds of processors contained in the servers in the group of servers, security levels of the servers in the group of servers, and terms of one or more service level agreements.

12. The method according to claim 6, further comprising:
collecting inlet and outlet temperatures of the servers in the group of servers;
collecting supply air temperatures for one or more CRAC units;
calculating supply heat indexes of the servers in the group of servers based upon the collected inlet and outlet temperatures and the supply air temperatures;
plotting the supply heat indexes against the inlet temperatures of the servers in the group of servers at a plurality of flow field settings;
determining a relationship of the plotted supply heat indexes and inlet temperatures; and
wherein the step of placing the workload comprises placing the workload on one or more of the servers in the group of servers based upon the relationship of the plotted supply heat indexes and inlet temperatures of the servers in the group of servers.

13. The method according to claim 12, further comprising:
determining which of the servers in the group of servers have plotted supply heat indexes and inlet temperatures that have nearly linear relationships prior to the step of placing the workload.

14. The method according to claim 1, further comprising:
categorizing the servers in the group of servers based upon the server workload indexes of the servers into a plurality of bins;
selecting the servers categorized in a predetermined bin;
withdrawing the servers categorized in a bin different from the predetermined bin;
estimating available states ($\Delta m$) to perform the workload in the servers categorized in the predetermined bin, wherein the available states ($\Delta m$) are estimated according to the following equation:

$$\Delta m_{i,j,k} = int[(1-SWI)(N-m)]_{i,j,k},$$

where the subscript i,j,k denotes the $k^{th}$ server in the $j^{th}$ rack of the $i^{th}$ row, SWI is the server workload index, N is the number of states in a server, and m is the number of states being utilized by the server;
determining which of the servers categorized in the predetermined bin have the available states; and
wherein the step of placing the workload on one or more of the servers comprises placing the workload on one or more servers having the available states.

15. The method according to claim 14, further comprising:
calculating placement factors for the one or more servers having the available states, wherein the placement factors (X) for each of the one or more servers is determined according to the following equation:

$$X_{i,j,k} = SHI_{i,j,k} - SWI_{i,j,k},$$

where the subscript i,j,k denotes the $k^{th}$ server in the $j^{th}$ rack of the $i^{th}$ row, SHI is a supply heat index and SWI is the server workload index; and
wherein the step of placing the workload further comprises placing the workload on one or more of the servers having relatively high positive values of X.

16. The method according to claim 15, wherein the step of placing the workload further comprises placing a portion of the workload on one or more servers in close proximity to one another, said method further comprising:
assessing an impact on thermal conditions based upon the workload placement; and
placing another portion of the workload on the one or more servers in close proximity to one another in response to the impact on thermal conditions being acceptable.

17. The method according to claim 15, wherein the step of placing the workload further comprises placing a portion of the workload on one or more servers in close proximity to one another, said method further comprising:
assessing an impact on thermal conditions based upon the workload placement;
withdrawing the portion of the workload from the one or more servers;
selecting another group of servers;
calculating server workload indexes of the servers in the another group of servers; and
placing the workload on one or more of the servers in the another group of servers based upon the server workload indexes of the servers in the another group of servers.

18. The method according to claim 1, further comprising:
determining whether thermal management conditions are acceptable in response to the step of placing the workload on one or more servers in the group of servers;
withdrawing the workload from the one or more servers in response to the conditions being unacceptable;
withdrawing the one or more servers from the group of servers to form a second group of servers;
calculating server workload indexes of the servers in the second group of servers; and
placing the workload on one or more of the servers in the second group of servers based upon the server workload indexes of the servers in the group of servers.

19. The method according to claim 18, wherein the step of determining whether the thermal management conditions are acceptable comprises calculating supply heat indexes of the set of servers following the step of placing the workload.

20. A data center having a system for workload placement among a plurality of servers, said data center comprising:
inlet temperature sensors configured to detect inlet temperatures of the plurality of servers;
outlet temperature sensors configured to detect outlet temperatures of the plurality of servers;
one or more CRAC units configured to deliver cooled air to the plurality of servers;
one or more supply air temperature sensors configured to detect temperatures of the cooled air supplied by the one or more CRAC units; and
a resource manager configured to receive the detected inlet, outlet and supply air temperatures and to calculate server workload indexes of the servers based upon the detected inlet, outlet, and supply air temperatures, wherein the server workload indexes comprise ratios of temperature rises due to re-circulation load for the servers in the group of servers to temperature rises due to re-circulation load for a set of servers, which includes the group of servers, and wherein the resource manager is further configured to place the workload on one or more of the servers based upon the server workload indexes of the servers.

21. The data center according to claim 20, wherein the resource manager is configured to calculate supply heat indexes of the plurality of servers and to calculate thermal multipliers for the plurality of servers, wherein the thermal multipliers are operable to estimate the relative abilities of the plurality of servers to accept new workloads compared to other servers.

22. The data center according to claim 21, wherein the supply heat indexes ($\phi$) are calculated according to the following equation:

$$\phi = \left[\frac{\delta Q}{Q + \delta Q}\right]_{i,j,k} = \left[\frac{T_{in} - T_{ref}}{T_{out} - T_{ref}}\right]_{i,j,k},$$

where $\delta Q$ is the heat load due to hot air infiltration, Q is the actual heat load, the subscript i,j,k denotes the $k^{th}$ server in the $j^{th}$ rack of the $i^{th}$ row, $T_{in}$ denotes the inlet temperature and $T_{out}$ denotes the outlet temperature of each of the plurality of servers, and $T_{ref}$ denotes the supply air temperatures of the one or more CRAC units; and wherein the thermal multipliers ($\theta$) are calculated according to the following equation:

$$\theta_{i,j,k} = \left(\frac{\overline{T}_{out} - T_{ref}}{T_{out} - T_{ref}}\right)_{i,j,k},$$

where $\overline{T}_{out}$ denotes an average server exhaust temperature of a second set of servers.

23. The data center according to claim 21, wherein the resource manager is further configured to plot the supply heat indexes against the inlet temperatures of the plurality of servers at a plurality of flow field settings, to determine a relationship of the plotted supply heat indexes and inlet temperatures, and to place the workload on one or more of the plurality of servers based upon the linearity of the relationships.

24. The data center according to claim 20, wherein the resource manager is further configured to select a group of servers to perform the workload through at least one of determining which of the plurality of servers have server workload indexes that fall below a predetermined maximum threshold value and withdrawing the servers having server workload indexes that exceed the predetermined maximum threshold value, and categorizing the plurality of servers into groups based upon the server workload indexes of the plurality of servers, selecting the servers categorized in a predetermined group, and withdrawing the servers categorized in a group different from the predetermined group.

25. The data center according to claim 24, wherein the resource manager is further configured to estimate available states of the servers in the group of servers, to determine which of the servers have available states, and to place the workload on one or more of the servers having the available states, wherein the available states ($\Delta m$) are estimated according to following equation:

$$\Delta m_{i,j,k} = int[[1-SWI](N-m)]_{i,j,k}$$

where the subscript i,j,k denotes the $k^{th}$ server in the $j^{th}$ rack of the $i^{th}$ row, SWI is the server workload index, N is the number of states in a server, and m is the number of states being utilized by the server.

26. The data center according to claim 25, wherein the resource manager is further configured to consider additional factors in selecting the workload placement, wherein the additional factors comprises one or more of speeds of processors contained in the plurality of servers, security levels of the plurality of servers, and terms of one or more service level agreements.

27. The data center according to claim 25, wherein the resource manager is further configured to calculate placement factors for the servers in the group of servers having the available states, wherein the placement factors (X) for each of the one or more servers is determined according to the following equation:

$$X_{i,j,k} = SHI_{i,j,k} - SWI_{i,j,k},$$

where the subscript i,j,k denotes the $k^{th}$ server in the $j^{th}$ rack of the $i^{th}$ row, SHI is a supply heat index and SWI is the server workload index; and wherein the step of placing the workload further comprises placing the workload on one or more of the servers having relatively high positive values of X.

28. The data center according to claim 20, wherein the resource manager is further configured to determine whether thermal management conditions are acceptable in response to the workload placement, to withdraw the workload from the one or more of the plurality of servers in response to the conditions being unacceptable, to withdraw the one or more of the plurality of servers from consideration to form a second group of servers, to calculate server workload indexes for the servers in the second group of servers, and to place the workload on one or more of the servers in the second group of servers based upon the server workload indexes of the servers in the group of servers.

29. The data center according to claim 28, wherein the determination of whether the thermal management conditions are acceptable comprises the calculation of supply heat indexes of the plurality of servers following placement of the workload.

30. A system for workload placement among a plurality of servers, said system comprising:

means for receiving a workload request;

means for selecting a group of servers from a set of servers capable of performing the requested workload;

means for collecting inlet and outlet temperatures of the servers in the group of servers;

means for collecting supply air temperatures for one or more CRAC units;

means for calculating supply heat indexes ($\phi$) of the servers in the group of servers based upon the collected inlet and outlet temperatures and the supply air temperatures;

means for calculating thermal multipliers ($\theta$) for the servers in the group of servers, wherein the thermal multipliers are operable to estimate the relative abilities of the servers in the group of servers to accept new workloads compared to the servers in the set of servers means for calculating server workload indexes (SWI) of the servers in the group of servers, wherein the server workload indexes are calculated according to the supply heat indexes and the thermal multipliers of the servers in the group of servers;

means for estimating available states to perform the workload in the servers of the group of servers having server workload indexes that fall below a predetermine maximum threshold value; and means for placing the workload on one or more of the servers in the group of servers having the available states.

31. The system according to claim 30, wherein the means for calculating supply heat indexes ($\phi$) of the servers in the group of servers comprises means for calculating the following equation:

$$\phi = \left[\frac{\delta Q}{Q + \delta Q}\right]_{i,j,k} = \left[\frac{T_{in} - T_{ref}}{T_{out} - T_{ref}}\right]_{i,j,k},$$

where $\delta Q$ is the heat load due to hot air infiltration, Q is the actual heat load, the subscript i,j,k denotes the $k^{th}$ server in the $j^{th}$ rack of the $i^{th}$ row, $T_{in}$ denotes the inlet temperature and $T_{out}$ denotes the outlet temperature of each server in the group of servers, and $T_{ref}$ denotes the supply air temperatures of the one or more CRAC units;

wherein the means for calculating thermal multipliers ($\theta$) means for calculating the following equation:

$$\theta_{i,j,k} = \left(\frac{\overline{T}_{out} - T_{ref}}{T_{out} - T_{ref}}\right)_{i,j,k},$$

where $\overline{T}_{out}$ denotes an average server exhaust temperature of the set of servers, and $T_{ref}$ denotes the supply air temperatures of the one or more CRAC units; and wherein the means for calculating server workload indexes (SWI) comprises means for calculating the following equation:

$$(SWI)_{i,j,k} = \frac{\phi}{\theta} = \left(\frac{(T_{in} - T_{ref})}{(\overline{T}_{out} - T_{ref})}\right)_{i,j,k}.$$

32. The system according to claim 30, wherein the means for estimating available states ($\Delta m$) comprises means for calculating the following equation:

$$\Delta m_{i,j,k} = int[[1-SWI](N-m)]_{i,j,k},$$

where the subscript i,j,k denotes the $k^{th}$ server in the $j^{th}$ rack of the $i^{th}$ row, N is the number of states in a server, and m is the number of states being utilized by the server.

33. A computer readable storage medium on which is embedded one or more computer programs, said one or more computer programs implementing a method of workload placement among a plurality of servers, said one or more computer programs comprising a set of instructions for:

receiving a workload request;

selecting a group of servers from a set of servers capable of performing the requested workload;

collecting inlet and outlet temperatures of the servers in the group of servers;

collecting supply air temperatures for one or more CRAC units;

calculating supply heat indexes ($\phi$) of the servers in the group of servers based upon the collected inlet and outlet temperatures and the supply air temperatures;

calculating thermal multipliers ($\theta$) for the servers in the group of servers, wherein the thermal multipliers are operable to estimate the relative abilities of the servers in the group of servers to accept new workloads compared to the servers in the set of servers calculating server workload indexes (SWI) of the servers in the group of servers, wherein the server workload indexes are calculated according to the supply heat indexes and the thermal multipliers of the servers in the group of servers;

estimating available states to perform the workload in the servers of the group of servers having server workload indexes that fall below a predetermine maximum threshold value; and placing the workload on one or more of the servers in the group of servers having the available states.

34. The computer readable storage medium according to claim 33, said one or more computer programs further comprising a set of instructions for:

calculating the supply heat indexes ($\phi$) of the servers in the group of servers based upon the following equation:

$$\phi = \left[\frac{\delta Q}{Q + \delta Q}\right]_{i,j,k} = \left[\frac{T_{in} - T_{ref}}{T_{out} - T_{ref}}\right]_{i,j,k},$$

where $\delta Q$ is the heat load due to hot air infiltration, Q is the actual heat load, the subscript i,j,k denotes the $k^{th}$ server in the $j^{th}$ rack of the $i^{th}$ row, $T_{in}$ denotes the inlet temperature and $T_{out}$ denotes the outlet temperature of each server in the group of servers, and $T_{ref}$ denotes the supply air temperatures of the one or more CRAC units;

calculating the thermal multipliers ($\theta$) means based upon the following equation:

$$\theta_{i,j,k} = \left(\frac{\overline{T}_{out} - T_{ref}}{T_{out} - T_{ref}}\right)_{i,j,k},$$

where $\overline{T}_{out}$ denotes an average server exhaust temperature of the set of servers, and $T_{ref}$ denotes the supply air temperatures of the one or more CRAC units; and calculating the server workload indexes (SWI) based upon the following equation:

$$(SWI)_{i,j,k} = \frac{\phi}{\theta} = \left(\frac{(T_{in} - T_{ref})}{(\overline{T}_{out} - T_{ref})}\right)_{i,j,k}.$$

35. The computer readable storage medium according to claim 33, said one or more computer programs further comprising a set of instructions for:

estimating the available states ($\Delta m$) based upon the following equation:

$$\Delta m_{i,j,k} = int[[1-SWI](N-m)]_{i,j,k},$$

where the subscript i,j,k denotes the $k^{th}$ server in the $j^{th}$ rack of the $i^{th}$ row, N is the number of states in a server, and m is the number of states being utilized by the server.

* * * * *

UNITED STATES PATENT AND TRADEMARK OFFICE
CERTIFICATE OF CORRECTION

PATENT NO. : 7,447,920 B2  
APPLICATION NO. : 10/929448  
DATED : November 4, 2008  
INVENTOR(S) : Ratnesh K. Sharma et al.

It is certified that error appears in the above-identified patent and that said Letters Patent is hereby corrected as shown below:

In column 5, line 67, delete "thermostats" and insert -- thermistors --, therefor.

In column 8, lines 7-8, delete "thermostats" and insert -- thermistors --, therefor.

In column 8, line 43, delete "is" before "CRAC".

In column 23, line 67, in Claim 25, after "$\Delta m_{i,j,k}=int[[1-SWI](N-m)]_{i,j,k}$" insert -- , --.

Signed and Sealed this

Eleventh Day of August, 2009

David J. Kappos  
*Director of the United States Patent and Trademark Office*